(12) United States Patent
Park et al.

(10) Patent No.: US 8,952,358 B2
(45) Date of Patent: Feb. 10, 2015

(54) ORGANIC LIGHT-EMITTING DISPLAY APPARATUS AND METHOD OF MANUFACTURING THE SAME

(75) Inventors: Sun Park, Yongin (KR); Chun-Gi You, Yongin (KR); Jong-Hyun Park, Yongin (KR); Jin-Hee Kang, Yongin (KR); Yul Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 723 days.

(21) Appl. No.: 13/211,655

(22) Filed: Aug. 17, 2011

(65) Prior Publication Data

US 2012/0097930 A1  Apr. 26, 2012

(30) Foreign Application Priority Data

Oct. 25, 2010  (KR) .................. 10-2010-0104237

(51) Int. Cl.
*H01L 51/52* (2006.01)
*H01L 51/00* (2006.01)

(52) U.S. Cl.
CPC ......... *H01L 51/5284* (2013.01); *H01L 51/0037* (2013.01)
USPC ............... 257/40; 257/E27.119; 257/E51.018

(58) Field of Classification Search
None
See application file for complete search history.

(56) References Cited

U.S. PATENT DOCUMENTS

| | | | |
|---|---|---|---|
| 5,969,702 A * | 10/1999 | Bae ................................ | 345/92 |
| 6,515,428 B1 * | 2/2003 | Yeh et al. .................. | 315/169.3 |
| 6,855,960 B2 | 2/2005 | Park et al. | |
| 2003/0155860 A1 | 8/2003 | Choi et al. | |
| 2007/0103061 A1* | 5/2007 | Li .................................. | 313/504 |
| 2007/0262313 A1* | 11/2007 | Lee et al. ........................ | 257/72 |

FOREIGN PATENT DOCUMENTS

| | | |
|---|---|---|
| KR | 10-2005-0010334 A | 1/2005 |
| KR | 10-2005-0121600 A | 12/2005 |

* cited by examiner

*Primary Examiner* — Wensing Kuo
(74) *Attorney, Agent, or Firm* — Knobbe, Martens, Olson & Bear, LLP

(57) ABSTRACT

An organic light-emitting display apparatus including a substrate; a black matrix layer formed over the substrate; an insulating layer formed over the black matrix layer; a thin film transistor (TFT) formed over the insulating layer; a pixel electrode connected to the TFT; and an organic layer formed over the pixel electrode. At least one hole is formed in at least one of the black matrix layer and the insulating layer, in a region where the black matrix layer and the insulating layer overlap each other.

12 Claims, 4 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2010-0104237, filed on Oct. 25, 2010, in the Korean Intellectual Property Office, the disclosure of which is incorporated herein in its entirety by reference.

BACKGROUND

1. Field

The present disclosure relates to organic light-emitting display apparatuses, and more particularly, to organic light-emitting display apparatuses having improved contrast and brightness properties by preventing light from reflecting off a display unit, and methods of manufacturing the same.

2. Description of the Related Technology

Organic light-emitting display apparatus use a self-emissive device in which electric current flows into a phosphor or phosphorescent organic layer, and light is generated from electrons and holes combining in the phosphor or phosphorescent organic layer. Since an organic light-emitting display apparatus is of a self-emissive type apparatus, the organic light-emitting display apparatus has wide viewing angles and excellent contrast. In addition, since an organic light-emitting display apparatus does not require a backlight, the organic light-emitting display apparatus may be miniaturized and lightweight and may have low power consumption.

In a typical organic light-emitting display apparatus, an organic light-emitting device and thin film transistors (TFTs) are formed over a substrate, and light generated by the organic light-emitting device is emitted to the outside through the substrate. The substrate forms or is located close to a display screen surface, and natural light coming through the display screen surface reflects off TFTs, metal wires for driving the TFTs, and metal electrodes of the organic light emitting device, and thus a user is dazzled by the reflected light, and the contrast and brightness of the organic light-emitting display apparatus may be reduced. In addition, even in an off-state, it is difficult to show black due to the reflected light.

A polarization plate may be attached to a front surface of a substrate in order to minimize reduction in contrast of an organic light-emitting display apparatus due to reflection of external light. However, it is expensive to attach the polarization plate, and substances coming from the polarization plate may cause defects. In addition, since the polarization plate reduces the transmittance of light emitted from an organic layer, the brightness of the organic light-emitting display apparatus may be reduced.

In addition, in order to prevent external light from being reflected, technologies using black matrixes in a region other than light-emitting pixels have been used. However, during the manufacture of large-size organic light-emitting displays, many processes such as crystallization, activation and annealing are performed at a high temperature, and black matrixes may be damaged during the processes, particularly, during the activation.

SUMMARY

One or more aspects of the present invention provide organic light-emitting display apparatuses having improved contrast and brightness properties by preventing a black matrix layer from breaking or being damaged.

One or more aspects of the present invention provide methods of manufacturing organic light-emitting display apparatuses having improved contrast and brightness properties by preventing a black matrix layer from breaking or being damaged.

According to an aspect of the present invention, there is provided an organic light-emitting display apparatus including a substrate; a black matrix layer formed over the substrate; an insulating layer formed over the black matrix layer; a thin film transistor (TFT) formed over the insulating layer and including an active layer including polysilicon; a pixel electrode connected to the TFT; an organic layer formed over the pixel electrode and including an emitting layer; and at least one hole that is formed in at least one of the black matrix layer and the insulating layer, in a region where the black matrix layer and the insulating layer overlap each other.

The black matrix layer may be covered by the insulating layer.

The active layer may overlap the black matrix layer.

The at least one hole may extend through the black matrix layer so as to divide the black matrix layer into pieces.

The black matrix layer may include a first sub-layer of a first material that is an insulating material, and a second sub-layer of a second material that is a metal.

The first material may include at least one selected from the group consisting of SiOx, SiNx, CrOx, NiOx, FeOx (x≥1), $Al_2O_3$, $SnO_2$, indium tin oxide (ITO), indium zinc oxide (IZO), ZnO, and $In_2O_3$.

The second material may include at least one selected from the group consisting of chromium (Cr), nickel (Ni), iron (Fe), cobalt (Co), vanadium (V), titanium (Ti), aluminum (Al), silver (Ag), silicon (Si), germanium (Ge), yttrium (Y), zinc (Zn), zirconium (Zr), tungsten (W), tantalum (Ta), copper (Cu), and platinum (Pt).

The black matrix may include at least one selected from the group consisting of CrOx/Cr, NiOx/Ni, and FeOx/Fe.

A thickness of the black matrix layer may be from about 1000 Å to about 4000 Å.

The insulating layer may include SiOx (x>1).

A thickness of the insulating layer may be from about 1000 Å to about 4000 Å.

The active layer may comprises at least two active layer pieces, and the at least one hole may be disposed between the at least two active layer pieces.

According to another aspect of the present invention, there is provided a method of manufacturing an organic light-emitting display apparatus, the method including forming a black matrix layer over a substrate; forming an insulating layer over the black matrix layer; forming at least one hole in the insulating layer so that the black matrix layer has a surface that does not contact the insulating layer; forming an active layer including polysilicon over the insulating layer to form a thin film transistor (TFT); forming a pixel electrode connected to the TFT; and forming an organic layer including an emitting layer over the pixel electrode.

According to another aspect of the present invention, there is provided a method of manufacturing an organic light-emitting display apparatus, the method including forming a black matrix layer over a substrate; forming at least one hole in the black matrix layer; forming an insulting layer over the black matrix layer; forming an active layer including polysilicon over the insulating layer to form a thin film transistor (TFT); forming a pixel electrode connected to the TFT; and forming an organic layer including an emitting layer over the pixel electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENT

Figure 1A:
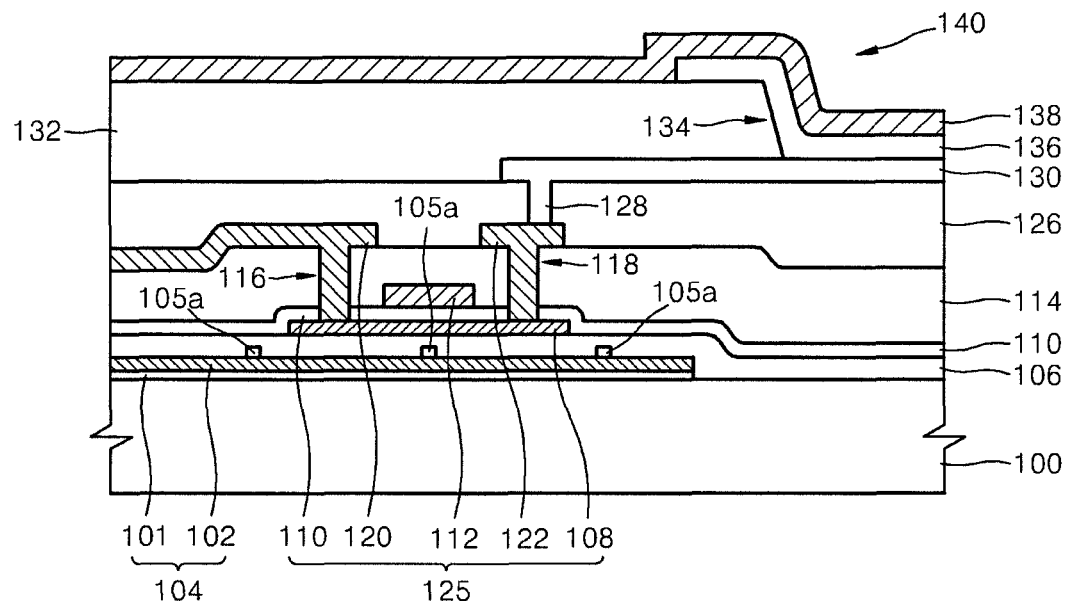
FIGS. 1A and 1B are cross-sectional views of an organic light-emitting display apparatus, according to embodiments of the present invention.

Reference will now be made in detail to embodiments, examples of which are illustrated in the accompanying drawings. Also, while describing the embodiments, detailed descriptions about related well-known functions or configurations that may diminish the clarity of the points of the embodiments of the present invention are omitted.

In the drawings, lengths and sizes of layers and regions may be exaggerated for clarity. Like reference numerals refer to like elements throughout. It should be understood that when an element, a layer or a region is referred to as being "on" another element, another layer or another region, the element, the layer or the region can be directly on the other element, the other layer or the other region without intervening elements, intervening layers or intervening regions, or the layer or the region can be over the other element, the other layer or the other region with intervening elements, intervening layers or intervening regions.

Figure 1B:
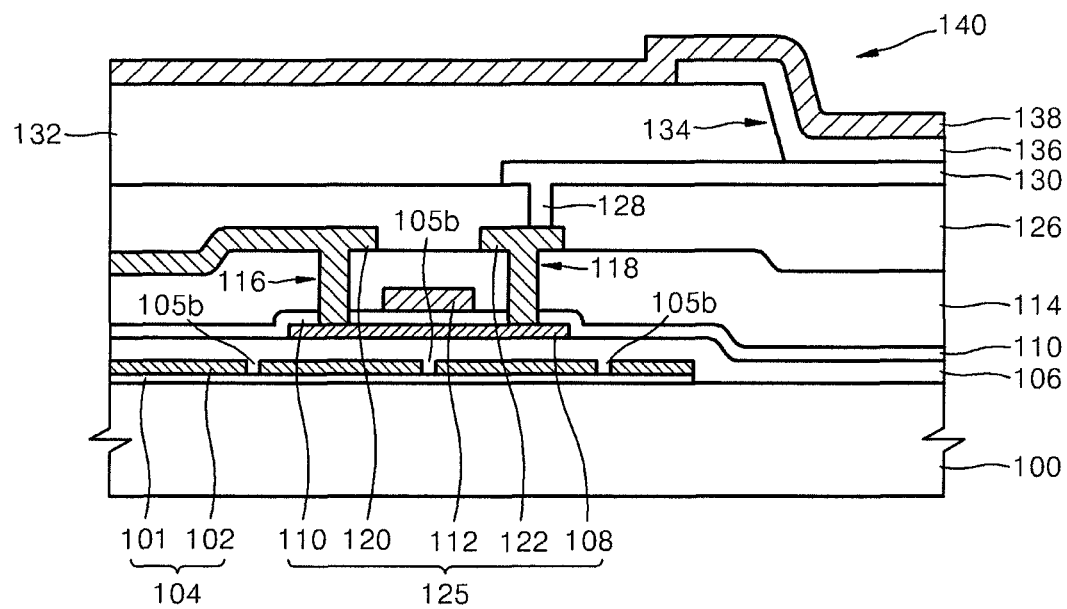

FIGS. 1A and 1B are cross-sectional views of an organic light-emitting display apparatus 140, according to embodiments of the present invention.

Referring to FIGS. 1A and 1B, in embodiments, the organic light-emitting display apparatus 140 includes a substrate 100; a black matrix layer 104 formed on the substrate 100; an insulating layer 106 formed on the black matrix layer 104; a thin film transistor (TFT) 125 formed on the insulating layer 106 and including an active layer 108 including polysilicon; a pixel electrode 130 formed to be connected to the TFT 125; an organic layer 136 formed on the pixel electrode 130 and including an emitting layer; and at least one hole 105a or 105b that is formed in at least one of the insulating layer 106 and the black matrix layer 104 in a region where the black matrix layer 104 and the insulating layer 106 overlap each other.

The black matrix layer 104 absorbs external light to prevent the external light from reaching devices and metal wires that are disposed above the black matrix layer 104 so as to prevent the external light from being reflected. The black matrix layer 104 may be formed on the substrate 100 except for a region corresponding to a pixel electrode, which is classified as an emissive region. Since the black matrix layer 104 has low reflectivity, and absorbs external light, if the black matrix layer 104 is formed below the TFT 125, it is possible to minimize the amount of the external light reflecting off the non-emissive region other than the pixel electrode.

In embodiments, the insulating layer 106 is disposed on the black matrix layer 104 so as to prevent thermal diffusion. The active layer 108 disposed on the insulating layer 106 is formed by depositing amorphous silicon, performing crystallization, activation and annealing on the resulting structure, and then crystallizing the resulting structure with polysilicon. While the active layer 108 is crystallized, heat may be transferred to the black matrix layer 104. The insulating layer 106 minimizes this heat transfer so as to protect the black matrix layer 104.

In some embodiments, the holes 105a and 105b are formed in the insulating layer 106 and the black matrix layer 104, respectively, in the region where the black matrix layer 104 and the insulating layer 106 overlap each other, for example, when viewed in a direction perpendicular to a screen surface. When the holes 105b are formed in the black matrix layer 104, the holes 105b may be formed to extend through the black matrix layer 104.

The holes 105a and 105b are formed in the insulating layer 106 and the black matrix layer 104, respectively, and prevent the black matrix layer 104 from breaking when crystallization, activation, and annealing are performed on the active layer 108, which are subsequent processes of the formation of the insulating layer 106.

In embodiments illustrated in FIG. 1A, when thermal energy is provided from an external source in order to perform the crystallization, the activation, and the annealing, delamination may likely occur at an interface between the substrate 100 and the black matrix layer 104, which has low adhesion force. In embodiments, the insulating layer 106 and the black matrix layer 104 do not partially contact each other due to the holes 105a formed in the insulating layer 106 and connected to the black matrix layer 104, and a stress generated by the thermal energy is concentrated on the holes 105a, thereby preventing the delamination at the interface between the substrate 100 and the black matrix layer 104. In FIG. 1B, when thermal energy is provided from an external source in order to perform the crystallization, the activation, and the annealing, the black matrix layer 104 through which the holes 105b are formed may linearly expand. Expanded portions between black matrix layers 104 may be compensated by the holes 105b. In one embodiment, the black matrix layer 104 may be covered by the insulating layer 106. For example, the substantially entire the black matrix layer may be covered by the insulating layer 106.

In some embodiments, the substrate 100 may be formed of a transparent glass material containing $SiO_2$ as a main component. However, the substrate 100 is not limited thereto, and thus may be formed of a transparent plastic material. The transparent plastic material used to form substrate 100 may be one selected from the group consisting of, for example, polyethersulphone (PES), polyacrylate (PAR,), polyetherimide (PEI), polyethyelene naphthalate (PEN), polyethyelene terephthalate (PET), polyphenylene sulfide (PPS), polyarylate, polycarbonate (PC), cellulose tree acetate (TAC), and cellulose acetate propionate (CAP). In a bottom-emission type organic light-emitting display apparatus in which an image is realized towards the substrate 100, the substrate 100 may be formed of a transparent material. Although not illustrated, in an embodiment, a buffer layer (not shown) may be formed on the substrate 100 in order to smoothen the substrate 110 and prevent the penetration of impurities.

The black matrix layer 104 is formed on the substrate 100. In embodiments, the black matrix layer 104 is formed on the substrate 100 except for a portion where a pixel electrode is formed. The black matrix layer 104 may be formed of a material that absorbs external light and prevents the external light from being reflected, and may include a first material as an insulating material and a second material as a metal. In some embodiments, the first material may be at least one selected from the group consisting of $SiO_x$, $SiN_x$, $CrO_x$, $NiO_x$, $FeO_x$ ($x \geq 1$), $Al_2O_3$, $SnO_2$, indium tin oxide (ITO), indium zinc oxide (IZO), ZnO, and $In_2O_3$, and the second material may be at least one selected from the group consisting of chromium (Cr), nickel (Ni), iron (Fe), cobalt (Co), vanadium (V), titanium (Ti), aluminum (Al), silver (Ag), silicon (Si), germanium (Ge), yttrium (Y), zinc (Zn), zirconium (Zr), tungsten (W), tantalum (Ta), copper (Cu), and platinum (Pt), but the present embodiment is not limited thereto.

In one embodiment, the black matrix layer 104 may be formed as CrOx/Cr, NiOx/Ni, or FeOx/Fe that is configured as a stack structure including, for example, the first material and the second material.

A thickness of the black matrix layer 104 may be, for example, from about 1000 Å to 4000 Å (Angstrom). When the thickness of the black matrix layer 104 satisfies this range, the black matrix layer 104 may sufficiently absorb external light.

The insulating layer 106 is formed on the black matrix layer 104. The insulating layer 106 may prevent thermal diffusion, and may protect the black matrix layer 104 against heat that is generated during crystallization, activation, and annealing which are subsequent processes of the formation of the insulating layer 106. In one embodiment, the insulating layer 106 includes at least one hole 105a connected to the black matrix layer 104. In another embodiment, at least one hole 105b that divides the black matrix layer 104 into various pieces is provided. In addition, the insulating layer 106 may cover the black matrix layer 104 so that the stress generated due to thermal energy may be concentrated on the holes 105a and 105b, or linear expansion of the black matrix layer 104 may be effectively compensated for.

The insulating layer 106 may have excellent heat resistance in a temperature from about 400° C. to about 700° C., and may be formed of, for example, a Si oxide.

A thickness of the insulating layer 106 may be, for example, from about 1000 Å to about 4000 Å. When the thickness of the insulating layer 106 satisfies this range, the insulating layer 106 may protect the black matrix layer 104 against thermal diffusion in subsequent processes, and may prevent stress affecting the substrate 100 from excessively increasing.

The TFT 125 is formed on the insulating layer 106. In embodiments, the TFT 125 includes the active layer 108, a gate insulating layer 110, a gate electrode 112, an interlayer insulating layer 114, and source and drain electrodes 120 and 122. The source and drain electrodes 120 and 122 respectively contact source and drain regions (not shown) in the active layer 108 through contact holes 116 and 118 that are formed through the interlayer insulating layer 114.

The active layer 108 may overlap the black matrix layer 104. For example, the active layer 108 may be spaced apart from the black matrix layer 104 by about 1 μm or more in order to obtain uniform TFT properties. When at least two active layers 108 are provided, the holes 105a or 105b may be disposed between the active layers 108 so as to prevent the black matrix layer 104 from breaking or being damaged.

A protective layer 126, formed of an inorganic insulating material, such as a Si nitride, is formed on the source and drain electrodes 120 and 122 and the interlayer insulating layer 114. The pixel electrode 130 is formed on the protective layer 126, and is connected to one of the source and drain electrodes 120 and 122, for example, the drain electrode 122, through a via hole 128. The pixel electrode 130, formed as a transparent conductive layer formed of, for example, ITO or IZO, functions as an anode of the organic light-emitting display apparatus 140.

An organic insulating layer 132 is formed on the protective layer 126 and the pixel electrode 130. An organic insulating layer 132 includes an opening 134 that exposes a portion of the pixel electrode 130 therethrough. The organic layer 136 is formed in the opening 134. A metal electrode 138 is formed so as to function as a cathode of the organic light-emitting display apparatus 140.

The pixel electrode 130 may be formed as a transparent electrode or a reflective electrode. When formed as a transparent electrode, in one embodiment, the pixel electrode 130 may be formed of ITO, IZO, ZnO, or $In_2O_3$. When formed as a reflective electrode, in another embodiment, the pixel electrode 130 may include a reflective layer formed of silver (Ag), magnesium (Mg), aluminium (Al), platinum (Pt), palladium (Pd), gold (Au), nickel (Ni), neodymium (Nd), iridium (Ir), chromium (Cr), or a compound thereof, and a layer that is formed on the reflective layer and is formed of ITO, IZO, ZnO, or $In_2O_3$.

The metal electrode 138 may be formed as a transparent electrode or a reflective electrode. When formed as a transparent electrode, in one embodiment, the metal electrode 138 may include a layer formed by depositing lithium (Li), calcium (Ca), LiF/Ca, LiF/Al, Al, Mg, or a compound thereof so as to face the organic layer 136 disposed between the pixel electrode 130 and the metal electrode 138, and an auxiliary electrode or a bus electrode line that is formed on the deposition layer and is formed of a material for forming a transparent electrode, such as ITO, IZO, ZnO, or $In_2O_3$. In addition, when formed as a reflective electrode, in another embodiment, the metal electrode 138 may be formed by depositing Li, Ca, LiF/Ca, LiF/Al, Al, Mg, or a compound thereof.

For example, in order to manufacture a bottom-emission type organic light-emitting display apparatus, the pixel electrode 130 may be a transparent electrode, and the metal electrode 138 may be a reflective electrode.

Various organic layers (e.g., the organic layer 136), including at least one emitting layer, may be disposed between the pixel electrode 130 and the metal electrode 138. The organic layer 136 may be formed of a low-molecular weight organic material or a high-molecular weight organic material.

When including a low-molecular weight organic material, the organic layer 136 may have a single or multi-layer structure including at least one selected from the group consisting of a hole injection layer (HIL), a hole transport layer (HTL), an organic emission layer (EML), an electron transport layer (ETL), and an electron injection layer (EIL) may be formed to have a single-layered or multi-layered structure. Examples of available organic materials may include copper phthalocyanine (CuPc), N,N'-di(naphthalene-1-yl)-N,N'-diphenyl-benzidine (NPB), tris(8-hydroxyquinoline)aluminum (Alq3), and the like. The low-molecular weight organic layer may be formed by vacuum deposition.

When including a high-molecular weight organic material, the organic layer 136 may mostly have a structure including a HTL and an EML. In this case, the HTL may be formed of poly(ethylenedioxythiophene) (PEDOT), and the EML may be formed of polyphenylene vinylenes (PPVs) or polyfluorenes.

The organic light-emitting display apparatus 140 is electrically connected to the TFT 125 formed in a lower portion of the organic light-emitting display apparatus 140.

Hereinafter, a method of manufacturing the organic light-emitting display apparatus 140 of FIG. 1A, having the above-described structure, will be described.

FIGS. 2A through 2E are cross-sectional views of a method of manufacturing the organic light-emitting display apparatus 140 of FIG. 1A, according to an embodiment of the present invention.

Figure 2A:
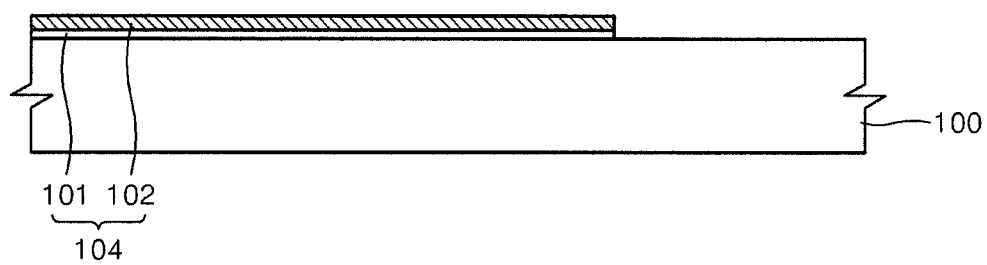
FIGS. 2A through 2F are cross-sectional views of a method of manufacturing the organic light-emitting display apparatus of FIG. 1A, according to an embodiment of the present invention.

Referring to FIG. 2A, in embodiments, a metal oxide layer 101 is formed by depositing an insulating material, such as CrOx, NiOx, or FeOx, to a thickness of about 500 Å on the substrate 100 formed of an insulating material, such as glass or quartz including $SiO_2$, and a metal layer 102 is formed by depositing a material with low reflectivity, such as Cr, Ni, or Fe, to a thickness of about 1000 Å on the metal oxide layer 101.

Then, the metal oxide layer 101 and the metal layer 102 are patterned by photolithography to form the black matrix layer 104 on the substrate 100 except for a portion where a pixel electrode is to be formed. Although not illustrated, the black matrix layer 104 may be divided into a plurality of pieces by at least one hole.

Figure 2B:
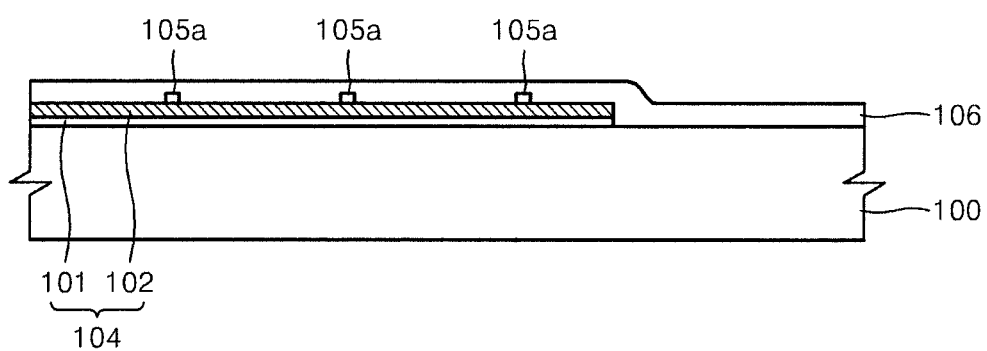

Referring to FIG. 2B, the insulating layer 106 is formed by depositing a Si oxide on a front surface of the substrate 100, as well as on the black matrix layer 104, to a thickness of about 2000 Å by using a plasma-enhanced chemical vapor deposition (PECVD) method. The insulating layer 106 prevents heat from being transferred to the metal layer 102 of the black matrix layer 104 when the active layer 108 is crystallized in subsequent processes. At least one hole 105a is formed in the insulating layer 106 to connect to the black matrix layer 104. The black matrix layer 104 is exposed instead of being covered by the insulating layer 106 in regions where the holes 105a are formed. Although not illustrated, in one embodiment, when the black matrix layer 104 includes at least one hole, none of the holes may be formed in the insulating layer 106.

Figure 2C:
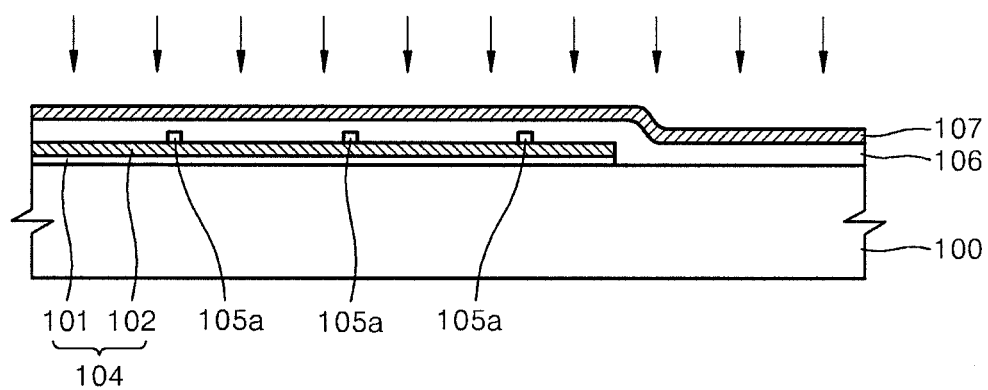

Referring to FIG. 2C, an active layer 107 is formed by depositing an amorphous silicon on the insulating layer 106 to a thickness of about 500 Å by using a low-pressure CVD (LPCVD) method or a PECVD method, and then the active layer 107 is crystallized to polysilicon by using a laser crystallization method, or the like. If necessary, a non-laser crystallization method may be performed.

Figure 2D:
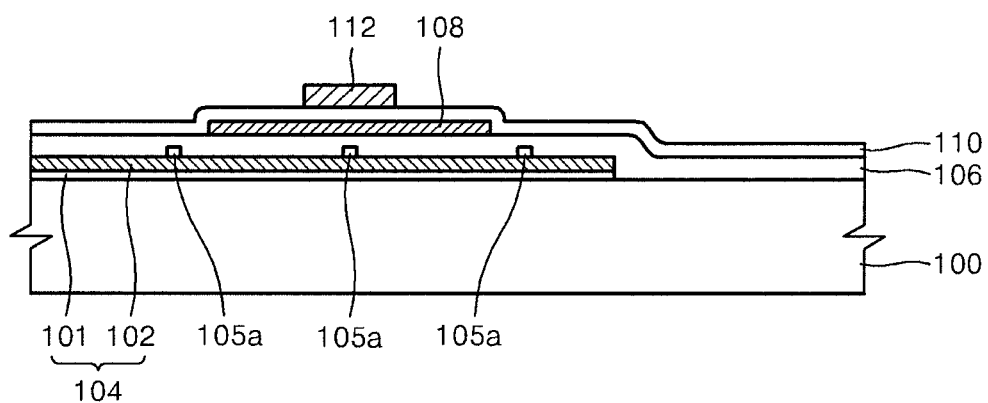

Referring to FIG. 2D, the active layer 108 is formed in a TFT region of a unit pixel by patterning the active layer 107 including the polysilicon by photolithography. In this case, the active layer 107 including the polysilicon may have grains with different sizes at edge and central portions of the black matrix layer 104, but may have grain with uniform sizes in a region spaced from an edge of the black matrix layer 104 by about 1 μm or more. Thus, if the active layer 108 is formed to be spaced apart from the edge of the black matrix layer 104 by about 1 μm or more, uniform TFT properties may be obtained.

Then, the gate insulating layer 110 is formed by depositing a Si oxide on the active layer 108 and the insulating layer 106 to a thickness from about 1000 Å to about 2000 Å by using a PECVD method. A gate layer is formed by depositing, for example, AlNd on the gate insulating layer 110 to a thickness of about 3000 Å by using a sputtering method, and the gate layer is patterned by photolithography. Thus, a gate line (not shown) extending in a first direction and the gate electrode 112 of a TFT branching from the gate line are formed. In this case, source and drain regions (not shown) of the TFT are formed on surfaces of two sides of the active layer 108 by injecting impurity ions by using a photomask used for patterning the gate layer.

Figure 2E:
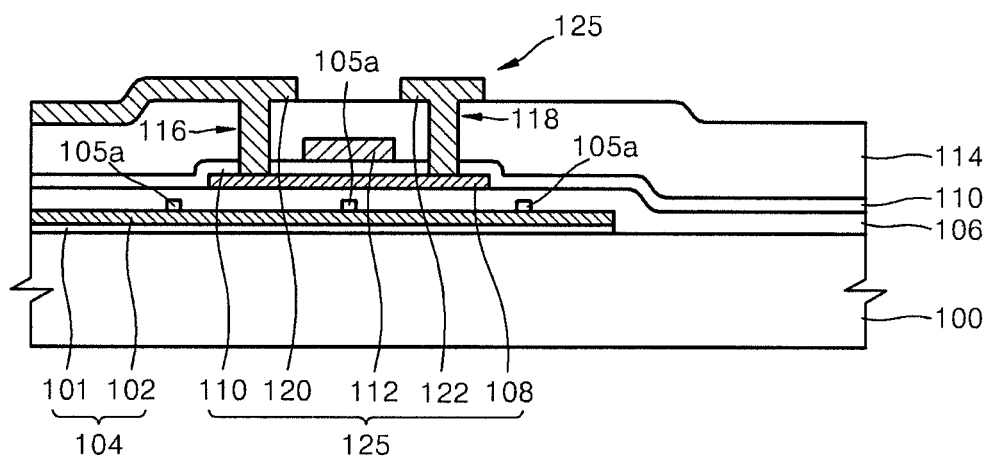

Referring to FIG. 2E, the interlayer insulating layer 114 is formed by activating doped ions of the source and drain regions, performing laser annealing or furnace annealing in order to cure damage of a Si layer and then depositing a Si nitride to a thickness of about 8000 Å on a front surface of the resulting structure.

Then, the contact holes 116 and 118 for respectively exposing the source and drain regions therethrough are formed by etching the interlayer insulating layer 114 by photolithography. A data layer is formed by depositing, for example, MoW or AlNd to a thickness from about 3000 to about 6000 Å in the contact holes 116 and 118, and the interlayer insulating layer 114, and then the data layer is patterned by photolithography to thus form a data line (not shown) and a direct-current signal line Vdd, which extend in a second direction perpendicular to the first direction, and source and drain electrodes 120 and 122 that contact the source and drain regions through the contact holes 116 and 118, respectively.

Through the above-described operations, the TFT 125 is formed to include the active layer 108, the gate insulating layer 110, the gate electrode 112, and source and drain electrodes 120 and 122.

Figure 2F:
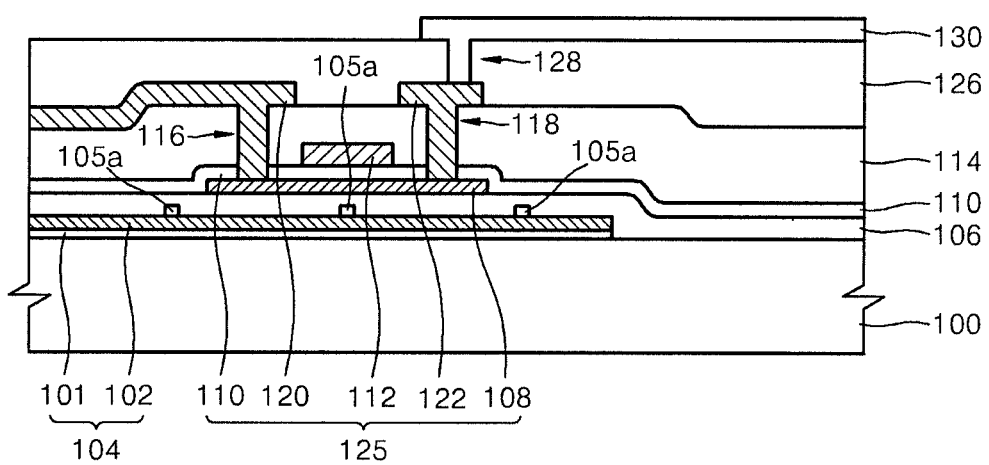

Referring to FIG. 2F, the protective layer 126 is formed by depositing a Si nitride to a thickness from about 2000 Å to about 3000 Å on the interlayer insulating layer 114, as well as on the TFT 125. The via hole 128 for exposing one of the source and drain electrodes 120 and 122, for example, the drain electrode 122 therethrough is formed by etching the protective layer 126 by photolithography. The pixel electrode 130, which contacts the drain electrode 122 through the via hole 128, is formed by forming a transparent conductive layer, such as an ITO or IZO layer, on the via hole 128 and the protective layer 126 and then patterning the transparent conductive layer by photolithography. The pixel electrode 130 functions as an anode of the organic light-emitting display apparatus 140.

Then, as illustrated in FIG. 1, the organic insulating layer 132 is formed on the protective layer 126, as well as on the pixel electrode 130, and then the opening 134 for exposing a portion of the pixel electrode 130 is formed by using exposure and developing processes. Then, the organic layer 136 is formed by sequentially forming a HTL (not shown), an EML (not shown), and an ETL (not shown) on the opening 134 and the organic insulating layer 132, and then the metal electrode 138, functioning as a cathode of the organic light-emitting display apparatus 140, is formed.

As described above, according to one or more embodiments of the present invention, an organic light-emitting display apparatus may have improved contrast and brightness properties by preventing a black matrix layer from breaking or being damaged.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a substrate comprising a display surface;
a black matrix layer formed over the substrate;
an insulating layer formed on and contacting the black matrix layer;
a thin film transistor (TFT) formed over the insulating layer and comprising an active layer comprising polysilicon;
a pixel electrode connected to the TFT;
an organic layer formed over the pixel electrode and comprising an emitting layer configured to emit light through a light emitting area of a pixel, the light emitting area being defined by the black matrix layer and generally corresponding to the emitting layer when viewed in a direction perpendicular to the display surface; and
at least one hole formed in at least one of the black matrix layer and the insulating layer in a region other than the light emitting area of the pixel such that the black matrix layer and the insulating layer do not contact with each other in at least one location where the at least one hole is provided.

2. The organic light-emitting display apparatus of claim 1, wherein the black matrix layer is covered by the insulating layer.

3. The organic light-emitting display apparatus of claim 1, wherein the active layer overlaps the black matrix layer.

4. The organic light-emitting display apparatus of claim 1, wherein the at least one hole extends through the black matrix layer so as to divide the black matrix layer into pieces in a cross-section of the apparatus taken in a plane perpendicular to the display surface.

5. The organic light-emitting display apparatus of claim 1, wherein the black matrix layer comprises a first sub-layer of a first material that is an insulating material, and a second sub-layer of a second material that is a metal.

6. The organic light-emitting display apparatus of claim 5, wherein the first material comprises at least one selected from the group consisting of SiOx, SiNx, CrOx, NiOx, FeOx ($x \geq 1$), $Al_2O_3$, $SnO_2$, indium tin oxide (ITO), indium zinc oxide (IZO), ZnO, and $In_2O_3$.

7. The organic light-emitting display apparatus of claim 5, wherein the second material comprises at least one selected from the group consisting of chromium (Cr), nickel (Ni), iron (Fe), cobalt (Co), vanadium (V), titanium (Ti), aluminum (Al), silver (Ag), silicon (Si), germanium (Ge), yttrium (Y), zinc (Zn), zirconium (Zr), tungsten (W), tantalum (Ta), copper (Cu), and platinum (Pt).

8. The organic light-emitting display apparatus of claim 1, wherein the black matrix layer comprises at least one selected from the group consisting of CrOx/Cr, NiOx/Ni, and FeOx/Fe.

9. The organic light-emitting display apparatus of claim 1, wherein a thickness of the black matrix layer is from about 1000 Å to about 4000 Å.

10. The organic light-emitting display apparatus of claim 1, wherein the insulating layer comprises SiOx ($x>1$).

11. The organic light-emitting display apparatus of claim 1, wherein a thickness of the insulating layer is from about 1000 Å to about 4000 Å.

12. The organic light-emitting display apparatus of claim 1, further comprising another active layer, and
wherein the at least one hole is disposed between the active layers.

* * * * *